United States Patent
Klam et al.

(10) Patent No.: US 10,041,360 B2
(45) Date of Patent: Aug. 7, 2018

(54) TURBOMACHINE COMPONENT WITH AN EROSION AND CORROSION RESISTANT COATING SYSTEM AND METHOD FOR MANUFACTURING SUCH A COMPONENT

(71) Applicant: Ansaldo Energia Switzerland AG, Baden (CH)

(72) Inventors: Hans-Joachim Klam, Zug (CH); Kai Ortner, Braunschweig (DE); Björn Ulrichsohn, Blakenfelde-Mahlow (DE)

(73) Assignee: ANSALDO ENERGIA SWITZERLAND AG, Baden (CH)

( * ) Notice: Subject to any disclaimer, the term of this patent is extended or adjusted under 35 U.S.C. 154(b) by 465 days.

(21) Appl. No.: 14/177,766

(22) Filed: Feb. 11, 2014

(65) Prior Publication Data
US 2014/0234096 A1    Aug. 21, 2014

(30) Foreign Application Priority Data
Feb. 15, 2013    (EP) .................................... 13155518

(51) Int. Cl.
*F01D 5/28* (2006.01)
*C23C 28/00* (2006.01)
(Continued)

(52) U.S. Cl.
CPC ................ *F01D 5/28* (2013.01); *C23C 14/35* (2013.01); *C23C 28/00* (2013.01); *C23C 28/322* (2013.01);
(Continued)

(58) Field of Classification Search
None
See application file for complete search history.

(56) References Cited

U.S. PATENT DOCUMENTS

| 4,741,975 A | 5/1988 | Naik et al. |
| 4,761,346 A * | 8/1988 | Naik ........................ C23C 28/00 428/627 |

(Continued)

FOREIGN PATENT DOCUMENTS

| CA | 2 772 041 A1 | 3/2011 |
| CN | 1757792 A | 4/2006 |

(Continued)

OTHER PUBLICATIONS

A Turbomachine is Widely known, namely, a gas or a Steam Turbine, New Polytechnic Dictionary, http://padaread.com/data/djvu/3b/f5/32803/Novyy-politehnicheskiy-slovar/560.png, pp. 560.

(Continued)

*Primary Examiner* — Jacob Cigna
(74) *Attorney, Agent, or Firm* — Buchanan Ingersoll & Rooney, PC

(57) ABSTRACT

A turbomachine component of a stationary turbomachine includes a substrate made of high alloyed 10% to 18% chromium steels or titanium alloys or nickel base alloys or cobalt base alloys with a substrate surface and an erosion and corrosion resistant coating system. The coating system includes a first layer, which is deposited on the substrate surface of the turbomachine component and acts as a corrosion resistant layer and a second layer. The second layer is deposited on the first layer and acts as an erosion resistant layer, wherein the first layer is a Zr single layer and the second layer is a W/WC multilayer.

10 Claims, 3 Drawing Sheets

(51) Int. Cl.
  *C23C 14/35* (2006.01)
  *F01D 9/02* (2006.01)
(52) U.S. Cl.
  CPC .......... *C23C 28/341* (2013.01); *C23C 28/347* (2013.01); *C23C 28/40* (2013.01); *C23C 28/42* (2013.01); *F01D 5/288* (2013.01); *F01D 9/02* (2013.01); *Y02T 50/671* (2013.01)

(56) References Cited

U.S. PATENT DOCUMENTS

| | | | | |
|---|---|---|---|---|
| 4,927,713 | A * | 5/1990 | Garg | C23C 16/14 428/627 |
| 5,145,739 | A * | 9/1992 | Sarin | C23C 30/005 428/336 |
| 5,547,767 | A * | 8/1996 | Paidassi | C23C 14/0021 204/192.16 |
| 5,702,829 | A * | 12/1997 | Paidassi | C23C 14/0021 428/610 |
| 5,740,515 | A | 4/1998 | Beele | |
| 5,759,932 | A * | 6/1998 | Sangeeta | C09D 1/00 106/287.19 |
| 6,159,618 | A * | 12/2000 | Danroc | C23C 28/02 428/472 |
| 6,346,301 | B2 | 2/2002 | Beele et al. | |
| 6,382,920 | B1 | 5/2002 | Döpper | |
| 7,070,866 | B2 | 7/2006 | Rigney et al. | |
| 7,211,338 | B2 | 5/2007 | Strangman | |
| 7,250,224 | B2 | 7/2007 | Darolia et al. | |
| 7,262,240 | B1 * | 8/2007 | Breton | B05D 5/02 524/404 |
| 7,744,986 | B2 * | 6/2010 | Rice | F01D 5/288 428/212 |
| 8,017,195 | B2 | 9/2011 | Darolia et al. | |
| 8,920,881 | B2 * | 12/2014 | Eichmann | C23C 4/18 427/270 |
| 2002/0132131 | A1 | 9/2002 | Bossmann et al. | |
| 2004/0018393 | A1 * | 1/2004 | Fukui | C23C 14/0635 428/698 |
| 2004/0170859 | A1 * | 9/2004 | Darolia | C23C 28/02 428/635 |
| 2005/0079370 | A1 * | 4/2005 | Corderman | B82Y 30/00 428/469 |
| 2005/0266266 | A1 | 12/2005 | Rigney et al. | |
| 2006/0018760 | A1 | 1/2006 | Bruce et al. | |
| 2006/0078432 | A1 | 4/2006 | Darolia et al. | |
| 2007/0065679 | A1 | 3/2007 | Strangman | |
| 2007/0099027 | A1 * | 5/2007 | Krishnamurthy | B32B 15/01 428/698 |
| 2007/0148478 | A1 * | 6/2007 | Schmitz | C23C 28/3215 428/469 |
| 2008/0280130 | A1 | 11/2008 | Beele et al. | |
| 2008/0317601 | A1 | 12/2008 | Barril et al. | |
| 2010/0136254 | A1 | 6/2010 | Darolia et al. | |
| 2010/0226783 | A1 * | 9/2010 | Lipkin | C23C 4/06 416/241 B |
| 2011/0052406 | A1 | 3/2011 | Bruce et al. | |
| 2011/0165433 | A1 | 7/2011 | Pabla et al. | |
| 2011/0299996 | A1 * | 12/2011 | Uihlein | C23C 30/00 416/241 R |
| 2014/0234096 | A1 | 8/2014 | Klam et al. | |
| 2014/0301861 | A1 | 10/2014 | Bruce et al. | |

FOREIGN PATENT DOCUMENTS

| | | |
|---|---|---|
| CN | 1811006 A | 8/2006 |
| CN | 101198768 A | 6/2008 |
| EP | 0 366 289 | 5/1990 |
| EP | 1 647 612 A2 | 4/2006 |
| EP | 2 233 534 | 9/2010 |
| EP | 2 767 616 A1 | 8/2014 |
| JP | 58-20996 | 2/1983 |
| JP | 2004-150272 | 5/2004 |
| JP | 2005-350771 A | 12/2005 |
| JP | 2007-217795 A | 8/2007 |
| JP | 2010-209913 | 9/2010 |
| JP | 2013-503296 | 1/2013 |
| WO | 2005/103331 A1 | 11/2005 |
| WO | 2008/116757 | 10/2008 |
| WO | 2010/094256 | 8/2010 |

OTHER PUBLICATIONS

A corrosion-resistant material being a zirconium is widely know, New Polytechnic Dictionary, ed. Ishlinskii, Great Russian Encyclopedia, 2000, http://padaread.com/data/djvu/3b/f5/32803/Novyy-politehnicheskiy-slovar/607.png, pp. 607.

Office Action (Notification on Results of Patentability Check) dated Jul. 14, 2015, by the Russian Patent Office in corresponding Russian Patent Application No. 2014105551/06 (008873), and an English Translation of the Office Action. (14 pages).

Office Action (Notification of Reasons for Refusal) dated Aug. 3, 2015, by the Japanese Patent Office in corresponding Japanese Patent Application No. 2014-027195, and an English Translation of the Office Action. (7 pages).

Office Action with the Examination Search Report dated Feb. 5, 2016, by the Canadian Intellectual Property Office in corresponding Canadian Patent Application No. 2,842,589. (5 pages).

* cited by examiner

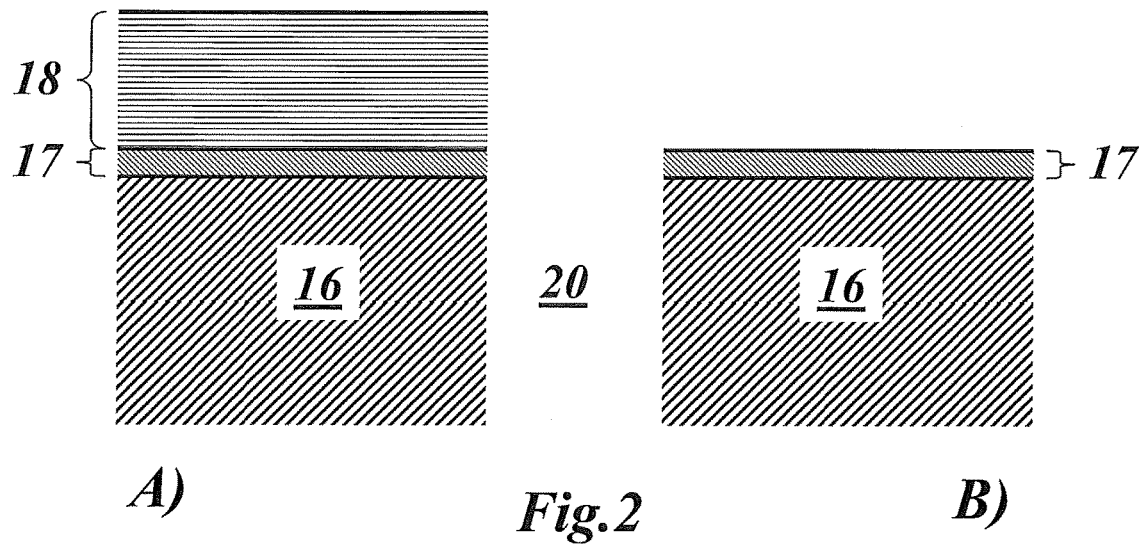
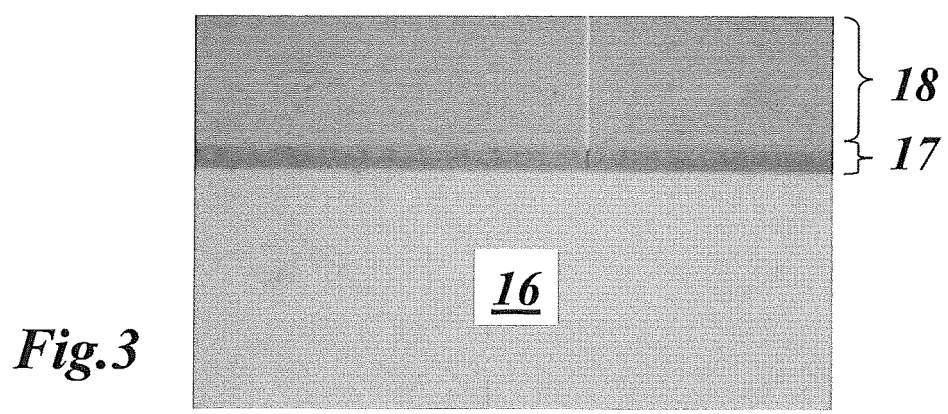

TURBOMACHINE COMPONENT WITH AN EROSION AND CORROSION RESISTANT COATING SYSTEM AND METHOD FOR MANUFACTURING SUCH A COMPONENT

CROSS-REFERENCE TO RELATED APPLICATIONS

This application claims priority to European application 13155518.7 filed Feb. 15, 2013, the contents of which are hereby incorporated in its entirety.

TECHNICAL FIELD

The present invention relates to the technology of stationary turbomachines. It refers to a turbomachine component made of high alloyed steels or titanium alloys or nickel base alloys or cobalt bases alloys and comprising an erosion and corrosion resistant coating system. It further refers to a method for manufacturing a turbomachine component with such a coating system.

BACKGROUND

Components used in stationary turbomachines, such components are for example compressor blades or vanes, gas turbines blades or vanes or heat shielding segments etc. are made of high alloyed (10% to 18% chromium) steels, nickel base alloys or cobalt base alloys. Those materials are the substrate materials of the turbomachine components.

In the prior art there are commercially available coating systems, for example SermeTel® 6000, which are used to protect compressor blades of industrial gas turbines. However, these systems have, due to Aluminum particles as sacrificial coating, good corrosion resistance but poor erosion resistance.

Document U.S. Pat. No. 6,159,618 relates to a multi-layer material that comprises a substrate made of aluminum, magnesium or their alloys, having possibly been subjected to a surface treatment, for example anodizing. The described technical solution is related to aircraft engines, for example propellers, rotors etc., which use light-weight materials. The substrate is being provided with a coating comprising a tungsten based deposit and an underlayer inserted between said substrate and said deposit of a material having mechanical and thermo-mechanical properties intermediate to those of said substrate and said deposit. Said tungsten based deposit can include at least one layer made of a material chosen for example from among tungsten, the carbides, silicides and nitrides of tungsten, tungsten alloys and their mixtures and solid solutions of nitrogen and of carbon in tungsten. The tungsten based deposit can comprise a single one of these layers or a stack of several of these layers. The underlayer can be composed of a single layer of a material chosen from among the materials quoted above such as chromium, molybdenum, niobium, titanium, zirconium, their nitrides and carbides, solid solutions of carbon and nitrogen in said metals, steels, aluminum-tungsten with a composition gradient and aluminum oxide.

Document JP 58020996 A discloses a corrosion-resisting and acid-resisting coating layer, for instance, of a flake resin obtained by admixing scale like glass flake to a resin of unsaturated polyester or vinyl ester being applied over the entire surface of a blade which is made of an ordinary material such as SS41. After drying and curing the coating layer, its surface is roughed by use of a hand grinder or emery paper. Then, a coating layer of a room temperature curing, erosion resisting material such as Fluor rubber is applied to the roughened surface of the coating layer, so that the blade is imparted with both of corrosion-resisting and erosion-resisting properties over the entire surface thereof. According to the above arrangement, efficiency of the blade manufacturing operation can be improved by reducing the thickness of both of the coating layers.

Document U.S. Pat. No. 5,740,515 discloses an article of manufacture which is subject to erosive and corrosive attack in a high-temperature environment, and which is formed of a substrate of nickel or cobalt-based superalloy, and a protective silicide coating disposed on the substrate. A thermal barrier layer of ceramic may be disposed between the superalloy and the silicide layer, and a MCrAlY layer may be disposed between the ceramic and the superalloy substrate. The silicide coating is preferably MoSi2.

Document US 2008/0317601 A discloses a turbomachine blade, which includes a blade body and a corrosion and erosion protective multilayered coating bonded thereto, the multilayered coating including an erosion resistant first layer at least covering a corrosion and erosion critical area of the blade body, and a sacrificial second layer provided over the first layer at least covering the first layer, preferably covering the blade totally. A method of manufacturing such a turbomachine blade includes the steps of providing a blade and depositing the erosion resistant first layer on the blade body so as to cover at least the corrosion and erosion critical area, followed by depositing the sacrificial second layer over the first layer at least covering the first layer.

Document US 2011/0165433 A teaches a process for providing a protective coating to a metal surface by applying a nickel or tantalum plate layer to the surface and dispersing particles of a hard material such as diamond, alumina, vanadium nitride, tantalum carbide and/or tungsten carbide within the nickel or tantalum plate layer as the plating is occurring.

There is still a need for a turbomachine component made of high alloyed steels, titanium alloys, nickel base alloys or cobalt bases alloys as a substrate, which is used in stationary turbomachines, and comprising a corrosion resistant coating, which coating can be used as base coat for an erosion resistant coating to simplify the protection of such components of stationary turbomachines.

SUMMARY

It is an object of the present invention to provide a turbomachine component used in a stationary turbomachine with a coating system, which is easy to apply and flexible in its application.

It is another object of the invention to establish a method for manufacturing such coating system onto the turbomachine component.

The turbomachine component according to the invention comprises a substrate made of high alloyed 10% to 18% chromium steels or titanium alloys or nickel base alloys or cobalt base alloys with a substrate surface and an erosion and corrosion resistant coating system, the coating system comprises a first layer, which is deposited on a substrate surface of said turbomachine component and acts as a corrosion resistant layer, and further comprises a second layer, which is deposited on said first layer and acts as an erosion resistant layer, wherein said first layer is a Zr single layer coating and said second layer is a W/WC multilayer coating.

According to an embodiment of the invention said first layer has a thickness, which is substantially smaller than the thickness of said second layer.

Specifically, said first layer has a thickness of 3-10 µm, and that said second layer has a thickness of 15-23 µm.

Specifically, said second layer comprises 10 or more alternating sublayers of W and WC.

More specifically, said second layer comprises 10 sublayers of W and 10 sublayers of WC with 0.75 to 1.25 µm thickness each.

According to an embodiment of the invention said turbomachine component is completely coated with said first layer, while said second layer is provided only at locations with high erosive loading.

Specifically, said component is a compressor blade or vane of a gas turbine, comprising an airfoil with a leading edge and a trailing edge, and that said second layer is provided at the leading edge.

The inventive method for manufacturing a turbomachine component according to the invention comprises the steps of:
a) providing the component with a substrate made of high alloyed 10% to 18% chromium steels or titanium alloys or nickel base alloys or cobalt base alloys having a substrate surface;
b) depositing on said substrate surface said first, corrosion resistant layer, said first layer is a Zr single layer coating and
c) depositing on said first corrosion resistant layer said second, erosion resistant layer, wherein said second layer is a W/WC multilayer coating, thereby using said first layer as a bond coat.

Specifically, said first, corrosion resistant layer is deposited with a thickness of 3-10 µm.

More specifically, W and WC single layers or sublayers of equal thickness are alternating deposited until an overall thickness of the multilayer of 15-23 µm is achieved.

According to another embodiment of the inventive method the deposition of the layers is done by means of standard magnetron sputtering.

According to a further embodiment of the inventive method the deposition of the layers is done by gas flow sputtering based on a hollow cathode glow discharge in combination with a suitable directed gas flow.

BRIEF DESCRIPTION OF THE DRAWINGS

The present invention is now to be explained more closely by means of different embodiments and with reference to the attached drawings.

FIGS. 2 A-B show different embodiments of the invention with a coating system at different locations (A) and (B) of a component like that of FIG. 1;

FIG. 3 shows a picture of a cross section of a coating system according to an embodiment of the invention.

DETAILED DESCRIPTION

Figure 1:
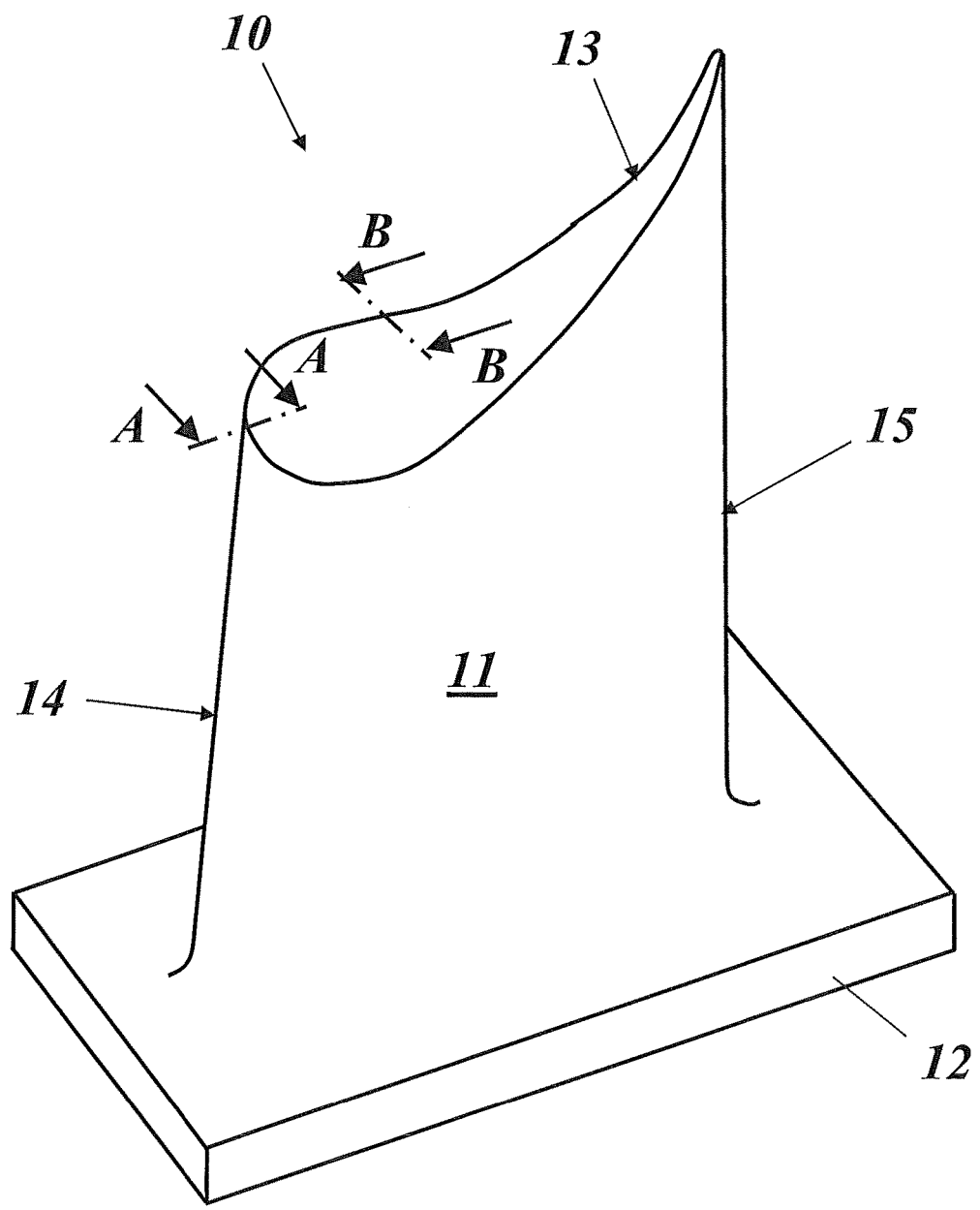
FIG. 1 shows in a perspective side view a turbomachine blade, which can be favourably provided with a coating system according to the invention.

FIG. 1 shows in a perspective side view a turbomachine component 10, here a blade, which can be favourably provided with a coating system according to the invention. The component 10 is a part of a stationary turbomachine and comprises a substrate made of a high alloyed steel with a chromium content of 10 to 18 weight-% or a titanium alloy or a nickel base alloy or a cobalt base alloy, for example Ni resp. Co superalloys, and a coating system 20 which is shown in detail in FIG. 2 and FIG. 3. The turbomachine blade 10 of FIG. 1, which may especially be a compressor blade of the compressor section of a gas turbine, comprises an airfoil 11, ending in a blade tip 13 at one end, and having a platform 12 at the other end. The airfoil 11, which is subject to a stream of hot gas, air, water droplets, or solid particles, has a leading edge 14 and a trailing edge 15. The leading edge 14 is especially exposed to the impinging stream of gas, air, water droplets, or solid particles and may thus be object of erosion and corrosion.

The erosion and corrosion resistant coating system combines erosion and corrosion resistance in one coating system. According to an embodiment of the invention it has a structure as shown in FIG. 3. The erosion and corrosion resistant coating system 20 of FIG. 3 comprises on a substrate 16 (e.g. blade body) a first layer 17 and a second layer 18. First layer 17 is a base coat with corrosion resistant properties, while second layer 18 is a top coat with erosion resistant properties. Preferably, the base coat 17 is applied all over the blade 10, while the top coat 18 is applied only on locations with high erosion such as leading or trailing edge 14 or 15, respectively.

The coating system 20 consists in one embodiment of a 10 µm thick Zr single layer 17 as base coat and a 20 µm thick multilayer W/WC coating 18. The coating is preferably applied by a new method, the gas flow sputtering (see for example document U.S. Pat. No. 6,382,920 B1 or U.S. Pat. No. 6,346,301 B2). The multilayer coating 18 consists of 10 or more alternating sublayers (18a,b in FIG. 4C) (each 1 µm thick) of W and WC. The concept is to coat the blade 10 overall with the Zr layer 17 for corrosion protection and to apply the W/WC multilayer coating 18 only at locations with high erosive loading. Such locations are mainly the leading edge from root to ¾ or whole length of airfoil 11.

In general, the core of the invention is to use a Zr single layer 17 (3-10 micron thick) as corrosion protection and a W/WC multilayer 18 (15-23 microns thick) as erosion protection on top and to apply the coatings on the blade at locations with high corrosion and/or erosion load.

If there is only corrosion, only the Zr layer 17 needs to be applied (FIG. 2B). If there is additional erosion on top of the Zr layer 17 acting as bond coat, a W/WC multilayer 18 can be applied (FIG. 2A).

In a further embodiment, a blade of the first stage of a compressor, made of a 15% chromium steel, is coated on the surface at the airfoil and the root platform with a layer 17 of Zr. This layer 17 has a thickness of 10 µm. The zirconium coating protects the blade material against corrosion. For erosion protection the leading edge is coated in a second step by a W/WC multilayer 18 containing 10 alternating single layers of tungsten (W) and tungsten carbide (WC). Each of those layers is 1 µm thick, so that the multilayer 18 has a total thickness of 20 µm. The zirconium coating beneath serves as adhesive agent for the W/WC multilayer.

The gas flow sputtering enables higher local deposition rates than standard magnetron sputtering. The deposition process typically works at several tenths of a millibar and requires no high vacuum environment. It is based on a hollow cathode discharge in combination with a suitable directed gas flow. The particular route of the gas flow also strongly decreases the residual gas influence on the target and substrate. However, the present invention would work also with other PVD methods, or even with thermal spaying or electroplating.

Figure 4:
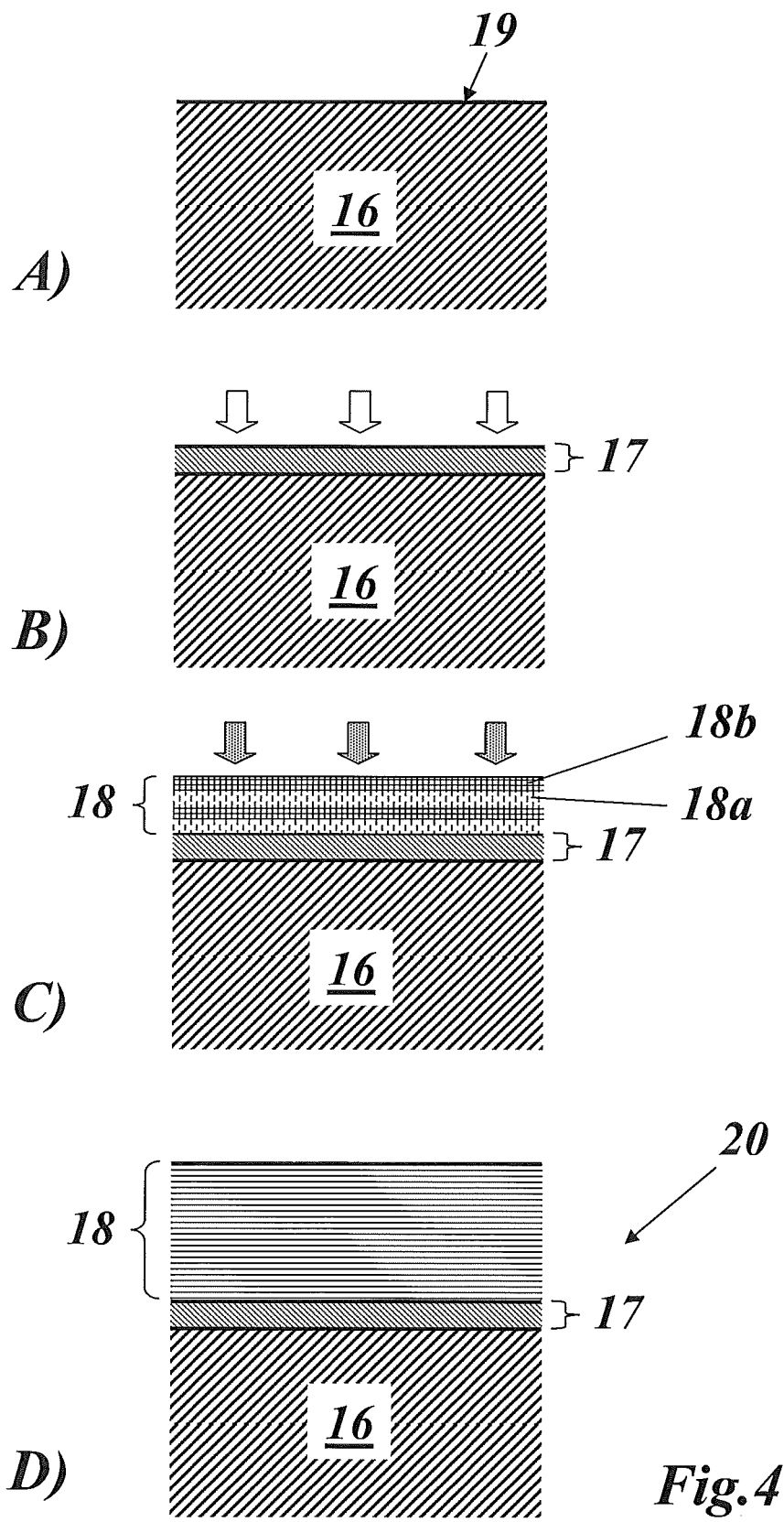
FIGS. 4 A-D show several process steps during manufacturing of a turbomachine component with a coating system according to the invention.

The method for manufacturing the turbomachine component 10 with the coating system 20 according to the invention comprises the steps of:
a) providing the component 10 with a substrate 16, made of high alloyed 10% to 18% chromium steels or titanium alloys or nickel base alloys or cobalt base alloys, having a substrate surface 19 (FIG. 4A);
b) depositing on said substrate surface 19 said first, corrosion resistant layer 17 (FIG. 4B), wherein the layer 17 is deposited as a Zr single layer; and
c) depositing on said first corrosion resistant layer 17 said second, erosion resistant layer 18, wherein the layer 18 is deposited as W/WC multilayer coating, thereby using said first layer 17 as a bond coat (FIG. 4C).

The erosion resistant W/WC layer 18 is applied layer by layer with always 1 micron thickness (see FIGS. 4C and 4D). The number of sublayers 18a, b may be different along the blade 10. Preferably, as erosion protection alternately always 10 sublayers W and 10 sublayers WC with 1 micron thickness each are applied (deposited). This multilayer coating 18 as erosion protection may be restricted to locations with high erosion load, e.g. the leading edge 14.

Erosion resistance is much higher with the coating system according to the invention, and therefore the compressor blades 10 can be longer in operation without reconditioning of the leading edge 14.

The invention claimed is:

1. A turbomachine component of a stationary turbomachine, comprising:
a substrate made of high alloyed 10% to 18% chromium steels or titanium alloys or nickel base alloys or cobalt base alloys with a substrate surface; and
an erosion and corrosion resistant coating system including:
a first layer deposited on the substrate surface of said turbomachine component as a corrosion resistant layer; and
a second layer deposited on said first layer as an erosion resistant layer, wherein said first layer is a single layer consisting of Zr having a thickness of 3-10 μm and said second layer consists of a W/WC multilayer.

2. The turbomachine component as claimed in claim 1, wherein said component is a compressor blade or vane of a gas turbine, comprising an airfoil with a leading edge and a trailing edge, and that said second layer is provided at the leading edge.

3. The turbomachine component as claimed in claim 1, wherein said first layer has a thickness, which is smaller than the thickness of said second layer.

4. The turbomachine component as claimed in claim 3, wherein said first layer has a thickness of 3-10 μm, and that the second layer has a thickness of 15-23 μm.

5. The turbomachine component as claimed in claim 1, wherein said second layer comprises 10 or more alternating sublayers of W and WC.

6. The turbomachine component as claimed in claim 5, wherein said second layer comprises 10 sublayers of W and 10 sublayers of WC with 0.75 to 1.25 μm thickness each.

7. A method for manufacturing a turbomachine component, comprising:
a) providing the component with a substrate made of high alloyed 10% to 18% chromium steels or titanium alloys or nickel base alloys or cobalt base alloys having a substrate surface;
b) depositing on said substrate surface said first, corrosion resistant layer, wherein the layer is deposited as a single layer coating consisting of Zr having a thickness of 3-10 μm,
c) depositing on said first corrosion resistant layer said second, erosion resistant layer, wherein the second layer consists of a W/WC multilayer coating, thereby using said first layer as a bond coat.

8. The method as claimed in claim 7, wherein W and WC single layers or sublayers of equal thickness are alternating deposited until an overall thickness of the multilayer of 15-23 μm is achieved.

9. The method as claimed in claim 7, wherein the deposition of each of the first layer and the second layer is done by magnetron sputtering.

10. The method as claimed in claim 7, wherein the deposition of each of the first layer and the second layer is done by gas flow sputtering based on a hollow cathode glow discharge in combination with a directed gas flow.

* * * * *

UNITED STATES PATENT AND TRADEMARK OFFICE
CERTIFICATE OF CORRECTION

PATENT NO. : 10,041,360 B2
APPLICATION NO. : 14/177766
DATED : August 7, 2018
INVENTOR(S) : Hans-Joachim Klam et al.

It is certified that error appears in the above-identified patent and that said Letters Patent is hereby corrected as shown below:

On the Title Page

In item (72), change "Blakenfelde-Mahlow (DE)" to --Blankenfelde-Mahlow (DE)--.

Signed and Sealed this
Fifth Day of February, 2019

Andrei Iancu
*Director of the United States Patent and Trademark Office*